United States Patent
Liu et al.

(10) Patent No.: US 12,394,673 B2
(45) Date of Patent: Aug. 19, 2025

(54) SEMICONDUCTOR MANUFACTURING PROCESS

(71) Applicant: United Semiconductor (Xiamen) Co., Ltd., Fujian (CN)

(72) Inventors: Dian Han Liu, Shamen (CN); Yuan-Chi Pai, Fujian (CN); Wen Yi Tan, Fujian (CN)

(73) Assignee: United Semiconductor (Xiamen) Co., Ltd., Fujian (CN)

(*) Notice: Subject to any disclaimer, the term of this patent is extended or adjusted under 35 U.S.C. 154(b) by 640 days.

(21) Appl. No.: 17/752,845

(22) Filed: May 24, 2022

(65) Prior Publication Data

US 2023/0343651 A1 Oct. 26, 2023

(30) Foreign Application Priority Data

Apr. 22, 2022 (CN) .......................... 202210429815.6

(51) Int. Cl.
*H01L 21/66* (2006.01)
(52) U.S. Cl.
CPC .................... *H01L 22/12* (2013.01)
(58) Field of Classification Search
None
See application file for complete search history.

(56) References Cited

U.S. PATENT DOCUMENTS

| 10,985,271 | B2 | 4/2021 | Yang |
| 11,081,579 | B2 | 8/2021 | Chang |
| 11,239,327 | B2 | 2/2022 | Lee |
| 11,264,492 | B2 | 3/2022 | Huang |
| 11,296,214 | B2 | 4/2022 | Lee |
| 2022/0214624 | A1* | 7/2022 | Lee .......................... G03F 9/7088 |

* cited by examiner

*Primary Examiner* — Sarah K Salerno
(74) *Attorney, Agent, or Firm* — Winston Hsu

(57) ABSTRACT

The invention provides a semiconductor manufacturing process, which comprises the following steps: using a computer system to define plurality of shots on a wafer range, distributing a plurality of observation points in each shot, finding out parts of incomplete shots from all of the shots, calculating the number of observation points in each incomplete shot, eliminating the incomplete shots with the number less than 3 observation points, counting all observation points in the remaining incomplete shots, and deleting a part of observation points until the total number of observation points meets a preset total number, and uniformly distributing all observation points, and performing an overlay measurement step on the remaining observation points to generate an offset vector map.

10 Claims, 3 Drawing Sheets

SEMICONDUCTOR MANUFACTURING PROCESS

BACKGROUND OF THE INVENTION

1. Field of the Invention

The present invention relates to the field of semiconductor manufacturing, in particular to a method for improving the precision of semiconductor overlay process.

2. Description of the Prior Art

Stacked structures are often formed in semiconductor manufacturing processes, that is, multiple stacked material layers are formed on the same substrate or material layer. After one material layer is formed, before the next material layer is formed, in order to align it with the previous material layer and form the material layer in the correct position, it is necessary to adjust the forming position of the material layer through an overlay process. When the accuracy of the stacking process is higher, the material layer of the semiconductor can be formed in the correct position, and the damage of the material layer can be prevented from affecting the yield of the whole semiconductor device.

SUMMARY OF THE INVENTION

The invention provides a semiconductor manufacturing process, which includes using a computer system to define plurality of shots on a wafer range, and a plurality of observation points are defined in each shot, finding out parts of incomplete shots from all of the shots, calculating the number of the observation points in each of the incomplete shots, and eliminating the incomplete shots with the number less than 3 observation points, counting all the observation points in the remaining incomplete shots, and deleting a part of the observation points until the total number of the observation points meets a preset total number, and all the observation points are uniformly distributed, and performing an overlay measurement step on the remaining observation points to generate an offset vector map.

The invention is characterized in that, in the conventional technology, the observation point of the incomplete shot is abandoned without calculating its offset, so that the vector offset calculation error of the incomplete shot is large, and the yield of dies in the incomplete shot is reduced. Different from the prior art, the invention additionally considers the observation points in the incomplete shots which are disposed beside the complete shot, but after some steps of sieving processes, the observation points can be uniformly distributed and the reliability can be improved. Therefore, when the offset vector map is generated, the accuracy of the offset vector in the incomplete shot can be effectively improved, and then the yield of dies in the incomplete shot can be greatly increased.

These and other objectives of the present invention will no doubt become obvious to those of ordinary skill in the art after reading the following detailed description of the preferred embodiment that is illustrated in the various figure and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Overlay process is a commonly used technology in semiconductor field. The principle is to distribute a plurality of observation points on a wafer, and then measure the offset between these observation points in a computer simulation system and those actually formed on the wafer, and make the offset values between them into an offset vector map. The offset vector map shows the difference between the expected position and the actual position of each observation point on the wafer. Then, the pattern shape or position can be corrected by the offset vector map, so that the pattern can be formed on the desired position of the user (for example, it can be accurately stacked on another material layer).

Figure 1:
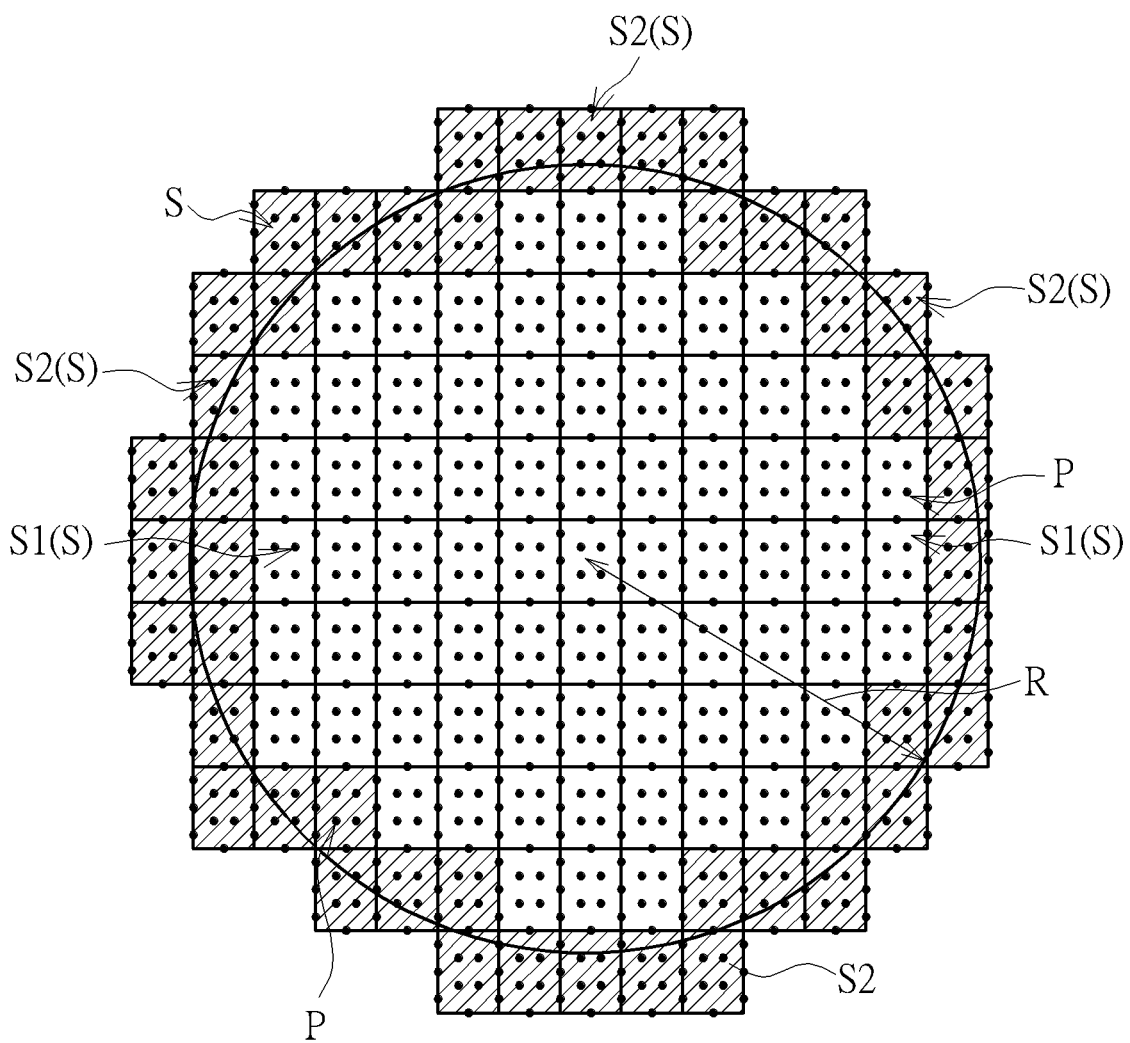
FIG. 1 shows the definition of complete shots and incomplete shots on a wafer.

The applicant found that there are still some shortcomings in the current overlay process. FIG. 1 shows the definition of complete shots and incomplete shots on a wafer. As shown in FIG. 1, a wafer W is provided, and the wafer W can be cut into a plurality of dies in a subsequent step, and the cut dies are not shown here for the sake of simplicity. In addition, a plurality of shots S are defined on the wafer W, the size or arrangement distribution of each shot S can be defined by the user. The shot S defined here can also be called field. The size of the shot S depends on the unit area that the light source can illuminate when the exposure machine performs a single exposure. That is to say, when the exposure step is carried out, the exposure machine will sequentially perform an exposure process in each shot S in a step-by-step manner. Usually, each shot S will contain a plurality of dies, and the scribe lines are included among the dies. In FIG. 1, for the sake of simplicity, the dies and scribe lines in each shot S are not shown, but it can be understood that the size or arrangement of the shot S, dies and scribe lines can be adjusted according to actual requirements.

Besides, all the above-mentioned shots S can be defined as complete shots S1 and or incomplete shots S2. In this embodiment, the complete shot S1 is defined as: all the areas of the complete shot S1 completely overlap with the wafer W, that is, all the dies contained in the complete shot S1 are within the range of the wafer W, while the incomplete shot S2 is defined as: only a part of the incomplete shot S2 overlaps with the wafer W, and the other part is located outside the range of the wafer W. Another judgment method is to set the effective radius of the wafer as R, draw a circle with the effective radius R from the center O of the wafer W, and then each shot S passing through the effective radius R is defined as the incomplete shot S2.

The effective radius R here varies according to the size of the wafer W. For example, if the diameter of a 12-inch wafer is about 300 millimeters (mm), the effective radius R is about 145 mm. The effective radius R is defined as the range where dies can be formed on the wafer W. Because the area where dies cannot be formed at the boundary region of the wafer W, the effective radius R will be slightly smaller than the actual wafer radius (that is, 300/2 mm). However, it should be noted that the effective radius R can be adjusted according to the actual process or wafer size, and the present invention is not limited to this.

In addition, a plurality of observation points P are distributed on the wafer W, and the locations of the observation points P can be defined by users, but the locations of the observation points in each shot S will be consistent, and the observation points P will be located on the dicing street. In some embodiments, the observation point P can also be regarded as an overlay mark in the overlay step, which is used to observe the shift, rotation or scaling before and after the overlay.

In the overlay process, if the observation point P is located in the incomplete shot S2, because the incomplete shot S2 is adjacent to the edge of the wafer W, observation points are outside the range of the wafer W and cannot be measured, the observation points P that can be measured in the incomplete shot S2 may also have uneven distribution, which has a great influence on the accuracy of measurement data. Therefore, the observation points in the incomplete shot S2 are easy to generate errors. In the conventional overlay process, the solution of the issues mentioned above is to ignore the observation point P located in the incomplete shot S2, and only calculate the offset of the observation point P in the remaining regions (such as the complete shot S1). However, this is equivalent to giving up the calculation of the offset of the observation point P in the incomplete shot S2, so the yield of the dies located in the incomplete shot S2 will also be greatly reduced.

Figure 2:
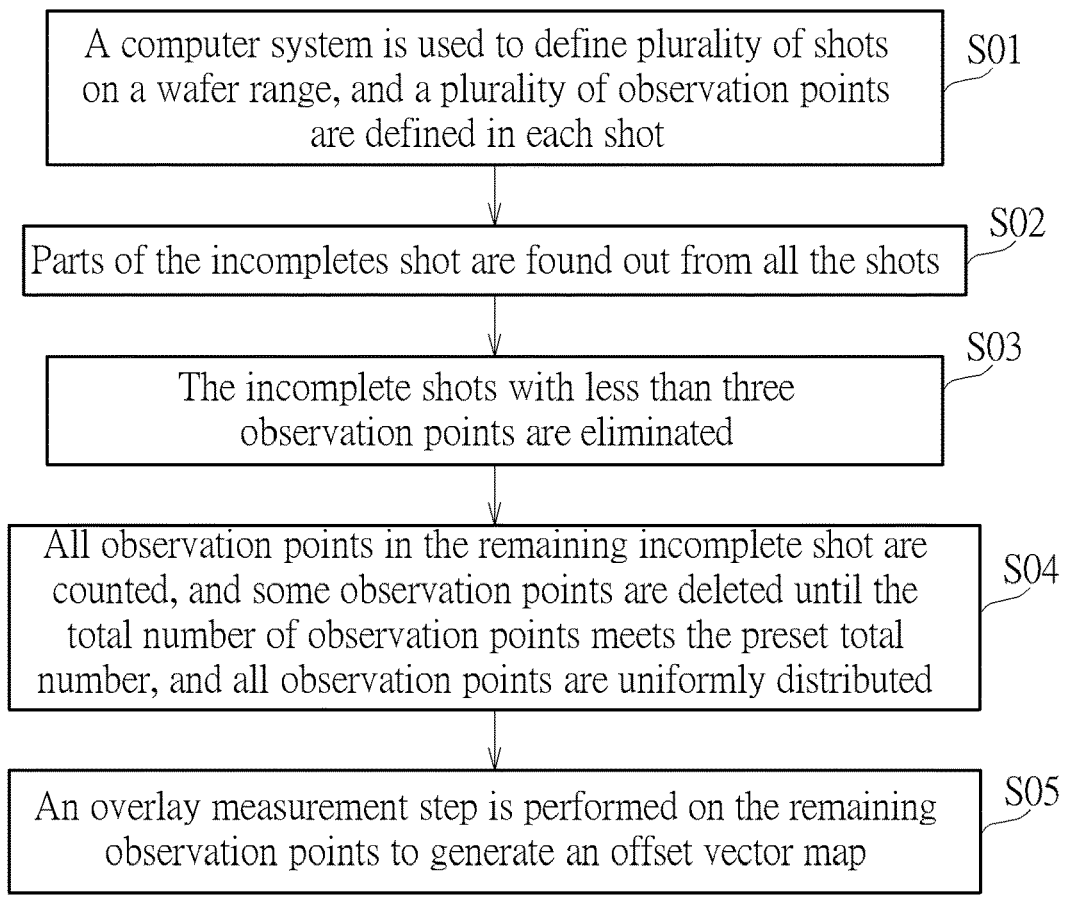
FIG. 2 shows the flow chart of improving the accuracy of the overlay step according to the present invention.

The invention provides a method for improving the accuracy of overlay steps, in particular to a method for selecting observation points in the incomplete shots S2. Through the method provided by the invention, the observation points in the incomplete shot S2 can be effectively screened, so that the screened observation points P located in the incomplete shots S2 can be uniformly distributed, which is beneficial to improving the accuracy of overlay processes in the incomplete shots S2. Please refer to FIG. 2, which shows the flow chart of improving the accuracy of the overlay step according to the present invention. As shown in FIG. 2, at first, in step S01, a computer system is used to define plurality of shots S on a wafer range, and a plurality of observation points P are defined in each shot S. Then, as shown in step S02, parts of the incompletes shot S2 are found out from all the shots S. The method of determining the incomplete shot S2 here is the same as the above, so it is not repeated here. In addition, other regions (shots) except the incomplete shot S2, such as the complete shot S1, are calculated by the same method as the conventional overlay process, so the present invention will not repeat this technology. The feature of the present invention is that in addition to the complete shot S1, the deviation or rotation of the observation point P in the incomplete shot S2 is also considered. The steps S01 and S02 described here can be described with reference to the above-mentioned FIG. 1 and related paragraphs, and are not repeated here.

Figure 3:
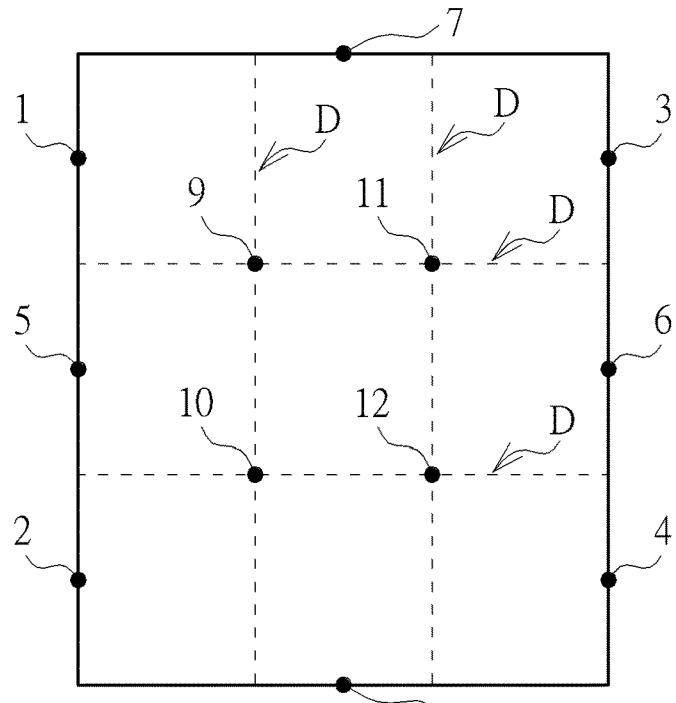
FIG. 3 shows the numbers of different locations in a shot.

Next, observation points are listed. Please refer to FIG. 3, which shows the numbers of different locations in a shot. As shown in FIG. 3, the user can define a plurality of locations (positions) in a shot S (for example, an incomplete shot S2), where the locations are the same as those of the observation points P in each shot S. For example, in this embodiment, there are 12 locations are defined, which are labeled as locations 1-12 in FIG. 3, and each location 1-12 is located at the boundary of the shot S or on the scribe lines D. That is to say, each shot S in FIG. 1 also contains 12 observation points, which are located at the above-mentioned corresponding locations 1 to 12. It should be noted that the number of 12 locations here are defined by the user, and more or less locations can be defined according to the requirements, and each location does not have to be the same as that in FIG. 3 (FIG. 3 is only an embodiment of the present invention). After defining the location locations 1~12, each observation point P can be listed in a table, as shown in the following Table 1:

TABLE 1

| Shot No. | Location 1 | Location 2 | Location 3 | Location 4 | Location 5 | Location 6 | Location 7 |
|---|---|---|---|---|---|---|---|
| 1 | | | 134.1172 | | | 139.3561 | 143.7654 |
| 2 | | | 126.5075 | 132.5812 | | 128.6988 | 136.8132 |
| 3 | | | 127.0582 | 126.0752 | | 125.8155 | 137.4414 |
| 4 | | | 135.67 | 127.8086 | | 131.2198 | |
| 5 | | | 131.4812 | | | 139.9766 | 139.6477 |
| 6 | 134.0444 | | | | 128.7525 | 139.2839 | 124.2092 |
| 7 | 126.4301 | 132.5072 | | | 128.6206 | | |
| 8 | 126.9809 | 125.9974 | | | 125.7356 | | |
| 9 | 135.5973 | 127.7319 | | | 131.1431 | | 126.2727 |
| 10 | | 137.3988 | 134.1101 | | 143.9115 | 126.1914 | 142.6986 |
| 11 | 131.4196 | | | 136.2663 | 139.9166 | 125.1241 | |
| 12 | | 128.689 | | | | | |
| 13 | 134.0484 | | | | 126.125 | | 126.4566 |
| 14 | | 136.9719 | 143.3755 | | | 132.7471 | |
| 15 | 139.8792 | | 128.4938 | | | 140.3217 | 133.5053 |
| 16 | | 136.2182 | | 124.4994 | 125.0704 | | |
| 17 | 143.329 | | 132.2427 | | 132.6965 | | 137.9479 |
| 18 | 128.4564 | | | | 140.2857 | 132.2523 | 123.2474 |
| 19 | | 124.4599 | | | | | |
| 20 | 132.2046 | | 123.6474 | | | | 128.0465 |
| 21 | | 136.2751 | | 127.9894 | | 141.8156 | |
| 22 | | | | 141.498 | 132.2267 | 127.1225 | |
| 23 | 123.6197 | | | | | | |

TABLE 1-continued

| Shot No. | Location 1 | Location 2 | Location 3 | Location 4 | Location 5 | Location 6 | Location 7 |
|---|---|---|---|---|---|---|---|
| 24 | | 127.9636 | | | 141.7918 | 137.0442 | |
| 25 | | 141.4862 | | 139.8575 | 127.109 | 125.2937 | |
| 26 | | | | | 137.0317 | 135.3496 | |
| 27 | | 139.8572 | | 141.3064 | 125.2933 | 126.9088 | |
| 28 | | | | | 135.3492 | 136.846 | |
| 29 | | 141.3176 | | | 126.9215 | 131.8413 | |
| 30 | | | 123.2083 | | | | |
| 31 | | | | 127.5652 | 136.8579 | 141.4324 | |
| 32 | | | 127.8596 | | 131.8662 | 139.7403 | |
| 33 | | | | 123.8447 | | | |
| 34 | 123.2334 | | 131.6265 | | | | 127.5205 |
| 35 | | 127.5904 | | 135.7135 | 141.4556 | | |
| 36 | 127.8983 | | 139.1485 | | 139.7757 | | 132.7985 |
| 37 | | 123.8837 | | 135.4686 | | 124.2535 | |
| 38 | 131.6624 | | 142.6175 | | | 131.9268 | 137.264 |
| 39 | | 135.5162 | 130.4467 | | 124.3068 | 139.0038 | |
| 40 | | | | 127.6959 | | | |
| 41 | | | 133.096 | | | 125.1115 | 125.4961 |
| 42 | 142.662 | | | 136.0393 | 131.977 | | |
| 43 | 130.5093 | | | | 139.0634 | | 138.5846 |
| 44 | | 127.7591 | 132.8994 | | | 138.1827 | 123.0128 |
| 45 | | | 125.2157 | 131.3492 | | 127.4273 | |
| 46 | | | 125.7721 | 124.7789 | | 124.5146 | |
| 47 | | | 134.4662 | 126.5301 | | 129.9729 | 125.096 |
| 48 | 133.156 | | | 136.2823 | 125.1778 | 142.8459 | 141.6585 |
| 49 | 132.9728 | | | | 138.2547 | | 142.5445 |
| 50 | 125.2934 | 131.423 | | | 127.5054 | | 135.5297 |
| 51 | 125.8491 | 124.8567 | | | 124.5945 | | 136.1638 |
| 52 | 134.538 | 126.6068 | | | 130.0495 | | 144.3461 |

| Shot No. | Location 8 | Location 9 | Location 10 | Location 11 | Location 12 | Total observation points |
|---|---|---|---|---|---|---|
| 1 | | | | 143.3301 | | 4 |
| 2 | 142.5618 | 144.8276 | | 134.3347 | 136.5526 | 8 |
| 3 | 136.4747 | 143.5272 | 142.0034 | 132.9323 | 132.5294 | 9 |
| 4 | 138.0207 | | | 139.3525 | 136.3979 | 6 |
| 5 | | | | 141.6841 | | 4 |
| 6 | 137.4956 | 133.941 | 137.7222 | 124.3131 | 129.467 | 9 |
| 7 | | 124.267 | 125.547 | | | 5 |
| 8 | | | | | | 3 |
| 9 | | 129.6735 | 125.3798 | | | 6 |
| 10 | 127.8935 | 143.8264 | 137.4171 | 134.9088 | 129.1404 | 10 |
| 11 | 143.1016 | 133.7805 | 140.2828 | 125.9109 | 133.6736 | 9 |
| 12 | | | | | | 1 |
| 13 | | 126.579 | | | | 4 |
| 14 | 129.0568 | | 139.8334 | 141.3276 | 133.199 | 7 |
| 15 | | 144.3818 | | 138.7271 | | 6 |
| 16 | 130.2908 | | 126.2212 | | | 5 |
| 17 | | 134.9856 | 125.7215 | 128.9248 | | 7 |
| 18 | | 133.8663 | 143.1938 | 129.4692 | 139.5846 | |
| 19 | | | | | | 1 |
| 20 | | 123.6738 | | | | 4 |
| 21 | 131.5787 | | 142.6065 | | 138.9783 | 6 |
| 22 | 143.6838 | 125.9492 | 135.9959 | 123.0783 | 133.6759 | 8 |
| 23 | | | | | | 1 |
| 24 | | 124.6935 | 135.3774 | 143.6716 | 133.0427 | 7 |
| 25 | 140.5329 | | 131.7356 | | 130.8571 | 7 |
| 26 | | 142.0101 | 131.0969 | 141.0549 | 130.2102 | 6 |
| 27 | 140.4382 | | 130.7003 | | 131.3273 | 7 |
| 28 | | 140.8822 | 130.0566 | 141.4934 | 130.6827 | 6 |
| 29 | 143.4059 | | 132.9656 | 124.5792 | 135.0521 | 7 |
| 30 | | | | | | 1 |
| 31 | 124.3732 | 142.8204 | 132.3329 | 144.9594 | 134.4253 | |
| 32 | | 127.7685 | 138.3693 | 131.8399 | 141.7753 | 7 |
| 33 | | | | | | 1 |
| 34 | | | | | | 3 |
| 35 | 131.0724 | | 137.7614 | | 141.1784 | 6 |
| 36 | | 136.4278 | | 141.8185 | | 6 |
| 37 | 129.5743 | | | | 124.0122 | 5 |
| 38 | | 126.4419 | | 132.2455 | 123.5004 | 7 |
| 39 | 142.2628 | | 131.2788 | 130.2637 | 137.7609 | 8 |
| 40 | | | | | | 1 |
| 41 | | | | | | 3 |
| 42 | 128.126 | 138.3628 | 130.7985 | | 137.3004 | 7 |
| 43 | | 138.0259 | | | | 4 |
| 44 | 136.4275 | | 126.4077 | 129.6789 | 134.6019 | 8 |
| 45 | | | | | | 3 |
| 46 | | | | | | 3 |

TABLE 1-continued

| | | | | | | |
|---|---|---|---|---|---|---|
| 47 | | | | 125.2686 | | 5 |
| 48 | 126.7446 | 131.0579 | 126.0753 | 139.8687 | 134.2879 | 10 |
| 49 | | 139.0141 | 144.6406 | | | 5 |
| 50 | 141.3439 | 129.7189 | 133.0998 | 140.2015 | 142.2995 | 9 |
| 51 | 135.202 | 128.2654 | 128.9694 | 138.8584 | 138.4434 | 9 |
| 52 | 136.7624 | 134.9071 | 132.942 | | 142.151 | 8 |

As shown in Table 1 above, the numbers of incomplete shots from 1 to 52 represent different incomplete shots S2, the number of incomplete shots can be adjusted according to the shots defined by the user, and the locations from 1 to 12 represent the observation points P at the corresponding locations in the incomplete shots S2. The numbers in the table represent the shortest distance (the straight-line distance) between the observation points P and the center of the wafer W in millimeters (mm). For example, take the incomplete shot of the incomplete shot No. 1 as an example, there are 4 observation points P located in the incomplete shot, namely, the observation point located at the location 4 and the shortest distance from the center of the wafer W is 134.1172 mm; the observation point located at the location 6 and the shortest distance from the center of the wafer W is 139.3561 mm; the observation point located at the location 7 and the shortest distance from the center of the wafer W is 143.7654 mm; and the observation point located at the location 11 and the shortest distance from the center of the wafer W is 143.3301 mm. As for the blank part in the rest of the table, it means that the observation point P cannot be measured because the location in the shot S is out of the range of the wafer W.

Next, as shown in step S03, the incomplete shots with less than three observation points are eliminated. Please refer to the rightmost column of Table 1, which represents the total number of the observation points P that can be measured in each incomplete shot 1~52. It can be found that the number of observation points in some incomplete shots is less than three (for example, the incomplete shots No. 12, 19, 23, 30, 33 and 40). According to the experimental results of the applicant, it is found that if the number of observation points in the incomplete shots is too small, it is easy to reduce the calculation accuracy of the subsequent overlay steps. Therefore, the incomplete shots with less than three observation points are eliminated in this invention to improve the reliability of calculation. That is, after the above step S03, a part of the incomplete shot S2 and the observation points P will be removed, and all of the remaining incomplete shots contain at least three or more observation points P. After elimination, the results are shown in Table 2 below:

TABLE 2

| Shot number | Location 1 | Location 2 | Location 3 | Location 4 | Location 5 | Location 6 | Location 7 |
|---|---|---|---|---|---|---|---|
| 1 | | | 134.1172 | | | 139.3561 | 143.7654 |
| 2 | | 126.5075 | 132.5812 | | | 128.6988 | 136.8132 |
| 3 | | 127.0582 | 126.0752 | | | 125.8155 | 137.4414 |
| 4 | | 135.67 | 127.8086 | | | 131.2198 | |
| 5 | | 131.4812 | | | | 139.9766 | 139.6477 |
| 6 | 134.0444 | | | 128.7525 | 139.2839 | | 124.2092 |
| 7 | 126.4301 | 132.5072 | | | 128.6206 | | |
| 8 | 126.9809 | 125.9974 | | | 125.7356 | | |
| 9 | 135.5973 | 127.7319 | | | 131.1431 | | 126.2727 |
| 10 | | 137.3988 | 134.1101 | | 143.9115 | 126.1914 | 142.6986 |
| 11 | 131.4196 | | | 136.2663 | 139.9166 | 125.1241 | |
| 13 | 134.0484 | | | | 126.125 | | 126.4566 |
| 14 | | 136.9719 | 143.3755 | | | 132.7471 | |
| 15 | 139.8792 | | 128.4938 | | | 140.3217 | 133.5053 |
| 16 | | 136.2182 | | 124.4994 | 125.0704 | | |
| 17 | 143.329 | | 132.2427 | | 132.6965 | | 137.9479 |
| 18 | 128.4564 | | | | 140.2857 | 132.2523 | 123.2474 |
| 20 | 132.2046 | | 123.6474 | | | | 128.0465 |
| 21 | | 136.2751 | | 127.9894 | | 141.8156 | |
| 22 | | | | 141.498 | 132.2267 | 127.1225 | |
| 24 | | 127.9636 | | | 141.7918 | 137.0442 | |
| 25 | | 141.4862 | | 139.8575 | 127.109 | 125.2937 | |
| 26 | | | | | 137.0317 | 135.3496 | |
| 27 | | 139.8572 | | 141.3064 | 125.2933 | 126.9088 | |
| 28 | | | | | 135.3492 | 136.846 | |
| 29 | | 141.3176 | | | 126.9215 | 131.8413 | |
| 31 | | | | 127.5652 | 136.8579 | 141.4324 | |
| 32 | | | 127.8596 | | 131.8662 | 139.7403 | |
| 34 | 123.2334 | | 131.6265 | | | | 127.5205 |
| 35 | | 127.5904 | | 135.7135 | 141.4556 | | |
| 36 | 127.8983 | | 139.1485 | | 139.7757 | | 132.7985 |
| 37 | | 123.8837 | | 135.4686 | | 124.2535 | |
| 38 | 131.6624 | | 142.6175 | | | 131.9268 | 137.264 |
| 39 | | 135.5162 | 130.4467 | | 124.3068 | 139.0038 | |
| 41 | | | 133.096 | | | 125.1115 | 125.4961 |
| 42 | 142.662 | | | 136.0393 | 131.977 | | |
| 43 | 130.5093 | | | | 139.0634 | | 138.5846 |
| 44 | | 127.7591 | 132.8994 | | | 138.1827 | 123.0128 |
| 45 | | | 125.2157 | 131.3492 | | 127.4273 | |

TABLE 2-continued

| | | | | | | |
|---|---|---|---|---|---|---|
| 46 | | | 125.7721 | 124.7789 | | 124.5146 | |
| 47 | | | 134.4662 | 126.5301 | | 129.9729 | 125.096 |
| 48 | 133.156 | | | 136.2823 | 125.1778 | 142.8459 | 141.6585 |
| 49 | 132.9728 | | | | 138.2547 | | 142.5445 |
| 50 | 125.2934 | 131.423 | | | 127.5054 | | 135.5297 |
| 51 | 125.8491 | 124.8567 | | | 124.5945 | | 136.1638 |
| 52 | 134.538 | 126.6068 | | | 130.0495 | | 144.3461 |

| Shot number | Location 8 | Location 9 | Location 10 | Location 11 | Location 12 | Total observation points |
|---|---|---|---|---|---|---|
| 1 | | | | 143.3301 | | 4 |
| 2 | 142.5618 | 144.8276 | | 134.3347 | 136.5526 | 8 |
| 3 | 136.4747 | 143.5272 | 142.0034 | 132.9323 | 132.5294 | 0 |
| 4 | 138.0207 | | | 139.3525 | 136.3979 | 6 |
| 5 | | | | 141.6841 | | 4 |
| 6 | 137.4956 | 133.941 | 137.7222 | 124.3131 | 129.467 | 9 |
| 7 | | 124.267 | 125.547 | | | 5 |
| 8 | | | | | | 3 |
| 9 | | 129.6735 | 125.3798 | | | 6 |
| 10 | 127.8935 | 143.8264 | 137.4171 | 134.9088 | 129.1404 | 10 |
| 11 | 143.1016 | 133.7805 | 140.2828 | 125.9109 | 133.6736 | 9 |
| 13 | | 126.579 | | | | 4 |
| 14 | 129.0568 | | 139.8334 | 141.3276 | 133.199 | 7 |
| 15 | | 144.3818 | | 138.7271 | | 6 |
| 16 | 130.2908 | | 126.2212 | | | 5 |
| 17 | | 134.9856 | 125.7215 | 128.9248 | | 7 |
| 18 | | 133.8663 | 143.1938 | 129.4692 | 139.5846 | 8 |
| 20 | | 123.6738 | | | | 4 |
| 21 | 131.5787 | | 142.6065 | | 138.9783 | 6 |
| 22 | 143.6838 | 125.9492 | 135.9959 | 123.0783 | 133.6759 | 8 |
| 24 | 124.6935 | | 135.3774 | 143.6716 | 133.0427 | 7 |
| 25 | 140.5329 | | 131.7356 | | 130.8571 | 7 |
| 26 | | 142.0101 | 131.0969 | 141.0549 | 130.2102 | 6 |
| 27 | 140.4382 | | 130.7003 | | 131.3273 | 7 |
| 28 | | 140.8822 | 130.0566 | 141.4934 | 130.6827 | 6 |
| 29 | 143.4059 | | 132.9656 | 124.5792 | 135.0521 | 7 |
| 31 | 124.3732 | 142.8204 | 132.3329 | 144.9594 | 134.4253 | 8 |
| 32 | | 127.7685 | 138.3693 | 131.8399 | 141.7753 | 7 |
| 34 | | | | | | 3 |
| 35 | 131.0724 | | 137.7614 | | 141.1784 | 6 |
| 36 | | 136.4278 | | 141.8185 | | 6 |
| 37 | 129.5743 | | | | 124.0122 | 5 |
| 38 | | 126.4419 | | 132.2455 | 123.5004 | 7 |
| 39 | 142.2628 | | 131.2788 | 130.2637 | 137.7609 | 8 |
| 41 | | | | | | 3 |
| 42 | 128.126 | 138.3628 | 130.7985 | | 137.3004 | 7 |
| 43 | | 138.0259 | | | | 4 |
| 44 | 136.4275 | | 126.4077 | 129.6789 | 134.6019 | 8 |
| 45 | | | | | | 3 |
| 46 | | | | | | 3 |
| 47 | | | | 125.2686 | | 5 |
| 48 | 126.7446 | 131.0579 | 126.0753 | 139.8687 | 134.2879 | 10 |
| 49 | | 139.0141 | 144.6406 | | | 5 |
| 50 | 141.3439 | 129.7189 | 133.0998 | 140.2015 | 142.2995 | 9 |
| 51 | 135.202 | 128.2654 | 128.9694 | 138.8584 | 138.4434 | 0 |
| 52 | 136.7624 | 134.9071 | 132.942 | | 142.151 | 8 |

Figure 4:
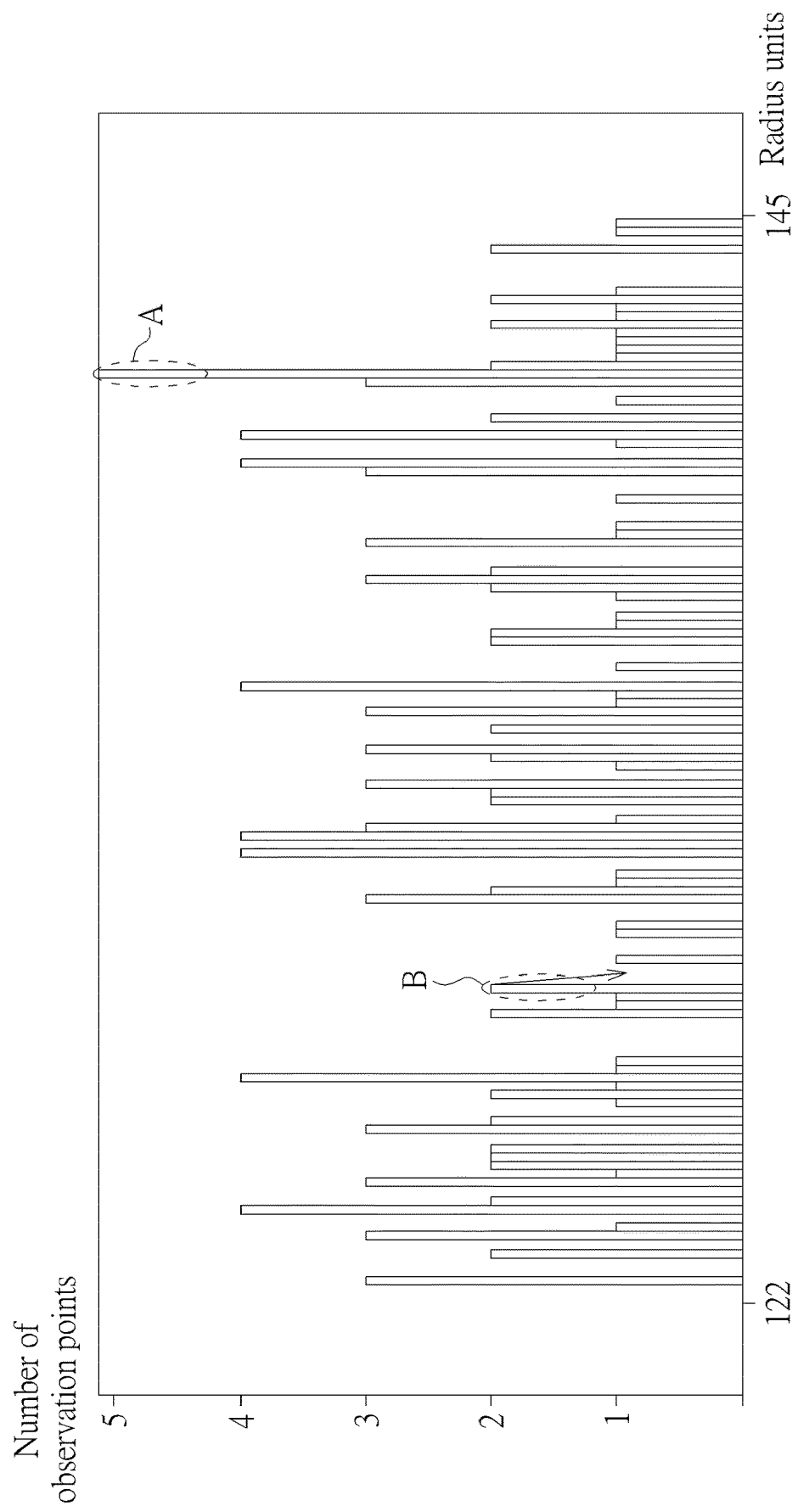
FIG. 4 shows an example of listing the remaining observation points in a histogram.

Then, as shown in FIG. 4, FIG. 4 shows an example of listing the remaining observation points in a histogram. The vertical axis of the histogram represents the number of observation points, and the horizontal axis represents the radius unit. Here, the definition of radius units is that the user sets a preset total number N, and each radius unit is: [(the linear distance from the farthest observation point to the center of the wafer)−(the linear distance from the nearest observation point to the center of the wafer)]/the preset total number N. For an actual example, please refer to Table 2, in which the farthest distance from the center of the circle (i.e. the maximum value in the table) is 144.9594 mm, while the shortest distance from the center of the circle (i.e. the minimum value in the table) is 123.0128 mm. If the preset total number N is set to 120 (the N of the present invention can be adjusted according to the requirements, but it is not necessarily 120, the N=120 here is only an example), the horizontal axis in the histogram of FIG. 4 should have 120 radius units, and each radius unit is (144.9594−123.0128)/120. Each radius unit may contain a corresponding number of observation points. In addition, in this embodiment, for the sake of brevity, 120 radius units are not completely drawn. Next, the remaining observation points in Table 2 are listed in the histogram of FIG. 4. It can be observed from FIG. 4 that there are different numbers of observation points under different radius units.

Next, in step S04: all observation points in the remaining incomplete shot are counted, and some observation points are deleted until the total number of observation points meets the preset total number, and all observation points are uniformly distributed. In detail, referring to FIG. 4, the purpose of the present invention is to select these observation points and delete the redundant observation points so that the remaining observation points are uniformly distributed. This is beneficial to the accuracy of the subsequent overlay steps. In other words, the number of observation points listed in Table 2 is too large, and it doesn't necessarily show uniform distribution. Therefore, one of the purposes of the present invention is to delete the observation points with dense distribution, reduce the total number of observation points and make the remaining observation points show uniform distribution.

In order to achieve the above purpose, in the histogram of FIG. 4, the largest number of observation points located under the same radius unit can be deleted preferentially, such as circled part A in FIG. 4, to avoid containing too many observation points in the same radius unit. Then, when there is no observation point in a certain radius unit (the vertical axis of the histogram in FIG. 4 is 0), at this time, if there are more than two observation points in the adjacent radius unit, one observation point can be removed from the adjacent radius unit or assigned to the radius unit with the vertical axis value of 0 (as shown in circled part B in FIG. 4). In addition, when deleting observation points, the number of observation points in each location can be kept as consistent as possible by computer operation control. The above steps of deleting observation points and moving (assigning or allocating) observation points are repeated until the number of the final observation points reaches the preset total number N (120 in this embodiment, but not limited to this). So far, the remaining observation points should be able to meet several conditions: (1) Each incomplete shot has more than 3 observation points; (2) The number of observation points at each location 1-12 is close to the same; and (3) Each radius unit contains an observation point.

Finally, in step S05: an overlay measurement step is performed on the remaining observation points to generate an offset vector map. It is worth noting that the observation points here include the observation points located in the complete shot S1 and the remaining observation points located in the incomplete shot S2 after screening or deleting. By the overlay measurement step, an offset vector map is formed, which can be applied to the overlay step to correct the parameters or positions of the overlapping patterns generated later. Here, the technical content of generating the offset vector map is a conventional technology in the field, so it will not be repeated here.

According to the above description and drawings, the present invention provides a semiconductor manufacturing process, which includes using a computer system to define plurality of shots S on a wafer range, and a plurality of observation points P are defined in each shot S, finding out some incomplete shots S2 in each shot S, calculating the number of observation points P in each incomplete shot S2, and removing some incomplete shots S2 with less than three observation points P, counting all observation points P in the remaining incomplete shot S2, deleting some observation points P until the total number of observation points P meets a preset total number N, uniformly distributing all observation points P, and performing an overlay measurement step on the remaining observation points P to generate an offset vector map.

In some embodiments of the present invention, the method of finding the incomplete shot S2 in each shot S includes defining a center of the wafer W and an effective radius value R, and drawing a circle according to the center and the effective radius R, wherein in each shot S, the shot passing through the circle is defined as the incomplete shot S2 (as shown in FIG. 1).

In some embodiments of the present invention, each shot S contains a plurality of complete dies, and each incomplete shot S2 contains at least one complete die.

In some embodiments of the present invention, the method of counting the observation points P in the remaining incomplete shot S2 includes counting the remaining observation points P in a table (i.e., the histogram of FIG. 4) according to the linear distance (straight-line distance) between each observation point P and the center of the circle.

In some embodiments of the present invention, the table is a histogram, and the preset total number is defined as N, where the horizontal axis of the table are N radius units, and the vertical axis of the table is the number of observation points.

In some embodiments of the present invention, among the remaining observation points, the linear distance from the farthest observation point to the center of the circle is defined as X1, the linear distance from the nearest observation point to the center of the circle is defined as X2, and each radius unit is: (X1−X2)/N.

In some embodiments of the present invention, the method of deleting a part of the observation point P includes preferentially deleting the observation point P with the largest longitudinal axis value according to a table (the histogram of FIG. 4).

In some embodiments of the present invention, which are further included in the horizontal axis of the table, if the number of observation points in a first radius unit is 0, and a second radius unit adjacent to the first radius unit contains more than two observation points, one observation point is allocated from the second radius unit to the first radius unit (i.e., as shown in circled part B in FIG. 4).

In some embodiments of the present invention, each incomplete shot is defined with a plurality of locations (such as locations 1-12 in FIG. 3), and counting the locations of the remaining observation points.

In some embodiments of the present invention, after a part of the observation points are deleted, the observation points located at each location are uniformly distributed.

To sum up, the invention is characterized in that, in the conventional technology, the observation point of the incomplete shot is abandoned without calculating its offset, so that the vector offset calculation error of the incomplete shot is large, and the yield of dies in the incomplete shot is reduced. Different from the prior art, the invention additionally considers the observation points in the incomplete shots which are disposed beside the complete shot, but after some steps of sieving processes, the observation points can be uniformly distributed and the reliability can be improved. Therefore, when the offset vector map is generated, the accuracy of the offset vector in the incomplete shot can be effectively improved, and then the yield of dies in the incomplete shot can be greatly increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor manufacturing process, comprising:
using a computer system to define plurality of shots on a wafer range, and a plurality of observation points are defined in each shot;
finding out parts of incomplete shots from all of the shots;

calculating the number of the observation points in each of the incomplete shots, and eliminating the incomplete shots with the number less than 3 observation points;

counting all the observation points in the remaining incomplete shots after eliminating the incomplete shots with the number less than 3 observation points, and deleting a part of the observation points until the total number of the observation points meets a preset total number, and all the observation points are uniformly distributed; and performing an overlay measurement step on the remaining observation points after deleting a part of the observation points to generate an offset vector map.

2. The semiconductor manufacturing process according to claim 1, wherein the step of finding out parts of incomplete shots from all of the shots comprising:

define a center and an effective radius value R of the wafer range, and draw a circle according to the center and the effective radius value R;

wherein the shots passing through the circle are defined as the incomplete shots.

3. The semiconductor manufacturing process according to claim 2, wherein each of the shots contains a plurality of complete dies, and each of the incomplete shots contains at least one complete die.

4. The semiconductor manufacturing process according to claim 2, wherein the step of counting all the observation points in the remaining incomplete shots comprising:

counting the remaining incomplete observation points in a table according to a linear distance between each observation point and the center of the circle.

5. The semiconductor manufacturing process according to claim 4, wherein the table is a histogram, and the preset total number is defined as N, wherein the horizontal axis of the table contains N radius units, and the vertical axis of the table is the number of observation points.

6. The semiconductor manufacturing process according to claim 5, wherein the linear distance from the farthest observation point with respect to the center of the circle of the remaining observation points is defined as X1, the linear distance from the nearest observation point with respect to the center of the circle of the remaining observation points is defined as X2, and each radius unit is: (x1−x2)/N.

7. The semiconductor manufacturing process according to claim 6, wherein the step of deleting the part of the observation points comprising:

performing a step (a): according to the table, the observation point with the largest value of the vertical axis is deleted; and repeating the step (a) until the number of the observation points reaches a preset total number N.

8. The semiconductor manufacturing process according to claim 7, further comprising:

in the horizontal axis of the table, if the number of observation points contained in a first radius unit is 0, and a second radius unit adjacent to the first radius unit contains more than two observation points, one observation point is allocated from the second radius unit to the first radius unit.

9. The semiconductor manufacturing process according to claim 1, wherein each of the incomplete shots is defined with a plurality of locations, and further comprises counting the locations of the remaining observation points.

10. The semiconductor manufacturing process according to claim 9, wherein after a part of the observation points are deleted, the observation points located at each location are uniformly distributed.

* * * * *